United States Patent [19]

Hsu et al.

[11] Patent Number: 5,166,556
[45] Date of Patent: Nov. 24, 1992

[54] PROGRAMMABLE ANTIFUSE STRUCTURE, PROCESS, LOGIC CELL AND ARCHITECTURE FOR PROGRAMMABLE INTEGRATED CIRCUITS

[75] Inventors: Fu-Chieh Hsu, Saratoga; Pei-Lin Pai, Cupertino, both of Calif.

[73] Assignees: Myson Technology, Inc., Cupertino; Knights Technology, Inc., Santa Clara, both of Calif.

[21] Appl. No.: 644,231

[22] Filed: Jan. 22, 1991

[51] Int. Cl.$^5$ .......................................... H03K 19/177
[52] U.S. Cl. .................................. 307/465; 307/202.1; 307/469; 437/922; 257/530
[58] Field of Search ...................... 307/465, 465.1, 468, 307/202.1, 482.1; 364/716, 784; 340/825.86, 825.87, 825.91; 437/46, 48, 922; 357/2

[56] References Cited

U.S. PATENT DOCUMENTS

| | | | |
|---|---|---|---|
| 4,238,839 | 12/1980 | Redfern et al. | 365/96 |
| 4,399,372 | 8/1983 | Tanimoto et al. | 307/449 X |
| 4,420,820 | 12/1983 | Preedy | 365/105 |
| 4,455,495 | 6/1984 | Masuhara et al. | 307/465 X |
| 4,507,756 | 3/1985 | McElroy | 365/104 |
| 4,507,757 | 3/1985 | McElroy | 365/104 |
| 4,565,712 | 1/1986 | Naguchi et al. | 437/48 X |
| 4,569,120 | 2/1986 | Stacey et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,678,889 | 7/1987 | Yamanaka | 219/121 |
| 4,721,868 | 1/1988 | Cornell et al. | 307/202.1 X |
| 4,748,490 | 5/1988 | Hollingsworth | 357/51 |
| 4,786,904 | 11/1988 | Graham, III et al. | 340/825 |
| 4,792,835 | 12/1988 | Sacarisen et al. | 357/23.6 |
| 4,796,074 | 1/1989 | Roesner | 357/51 |
| 4,823,181 | 4/1989 | Mohsen et al. | 357/51 |
| 4,839,864 | 6/1989 | Fujishima | 365/200 |
| 4,847,732 | 7/1989 | Stopper et al. | 357/2 X |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 3/1990 | Gordon et al. | 437/192 |
| 4,916,809 | 4/1990 | Boudou et al. | 29/852 |
| 4,924,287 | 5/1990 | Orbach | 357/51 |
| 4,937,475 | 6/1990 | Rhodes et al. | 307/465 X |
| 5,099,149 | 3/1992 | Smith | 307/202.1 X |

OTHER PUBLICATIONS

Gullette et al, "Laser Personalization of NMOS Digital Topologies", 1983 IEEE Int'l Symposium on Circuits and Systems, Newport Beach, Calif. May 2-4, 1983, pp. 1249-1252.

Ron Iscoff, "Characterizing Quickturn ASICs: . . . ", *Semiconductor International*, Aug. 1990, pp. 68-73.

*Primary Examiner*—David Hudspeth
*Attorney, Agent, or Firm*—Thomas E. Schatzel

[57] ABSTRACT

An integrated circuit of the present invention comprises antifuse elements which have been fabricated by depositing at under 500° C. an antifuse layer approximately 30 nanometers to 400 nanometers between layers of titanium (Ti), said antifuse layer comprising a stoichiometric or off-stoichiometric amorphous silicon-based dielectric layer, such that a heating of the said antifuse layer in excess of 500° C. by electrical or energy beam means will cause a chemical reduction reaction between the titanium and silicon-dioxide layers that yields more $Ti_5Si_3$, $TiSi$, and/or $TiSi_2$ than is yielded $TiO$, $Ti_2O_3$, $Ti_3O_5$, and/or $TiO_2$, and such that there results a conductive compound between said titanium layers which constitutes a short circuit.

22 Claims, 5 Drawing Sheets

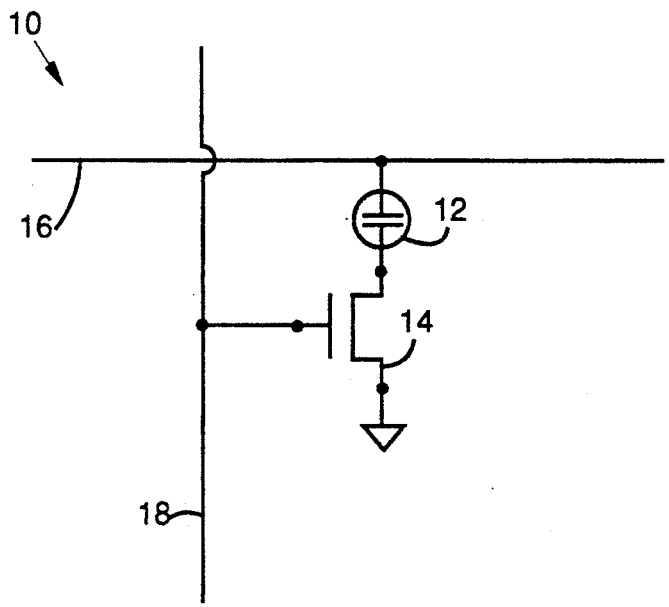
Fig_1
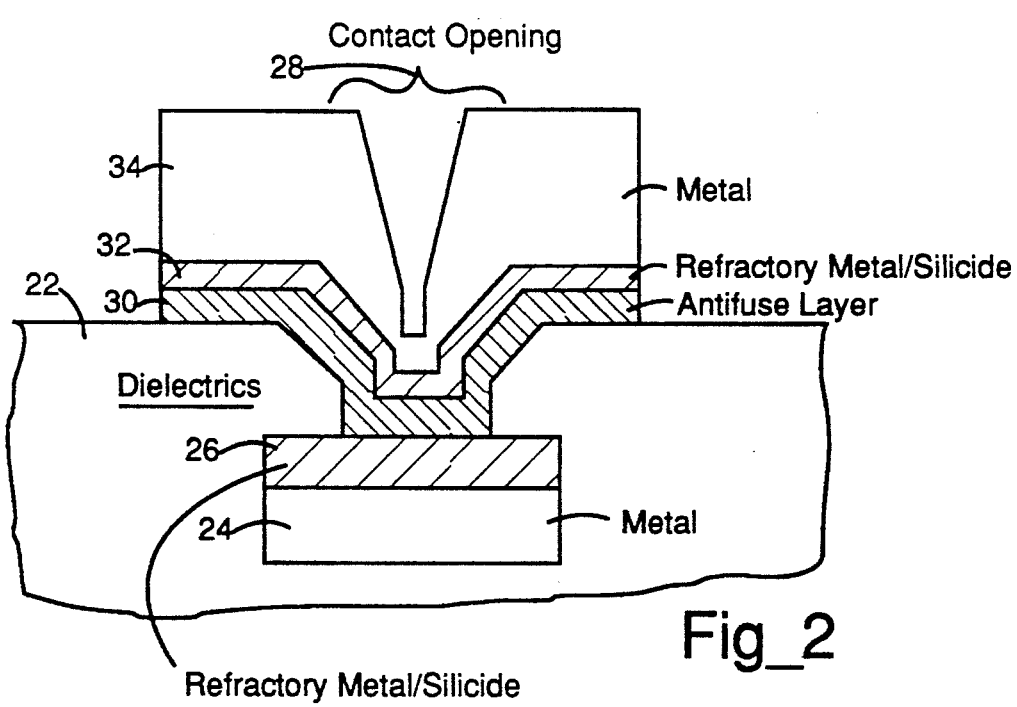
Fig_2

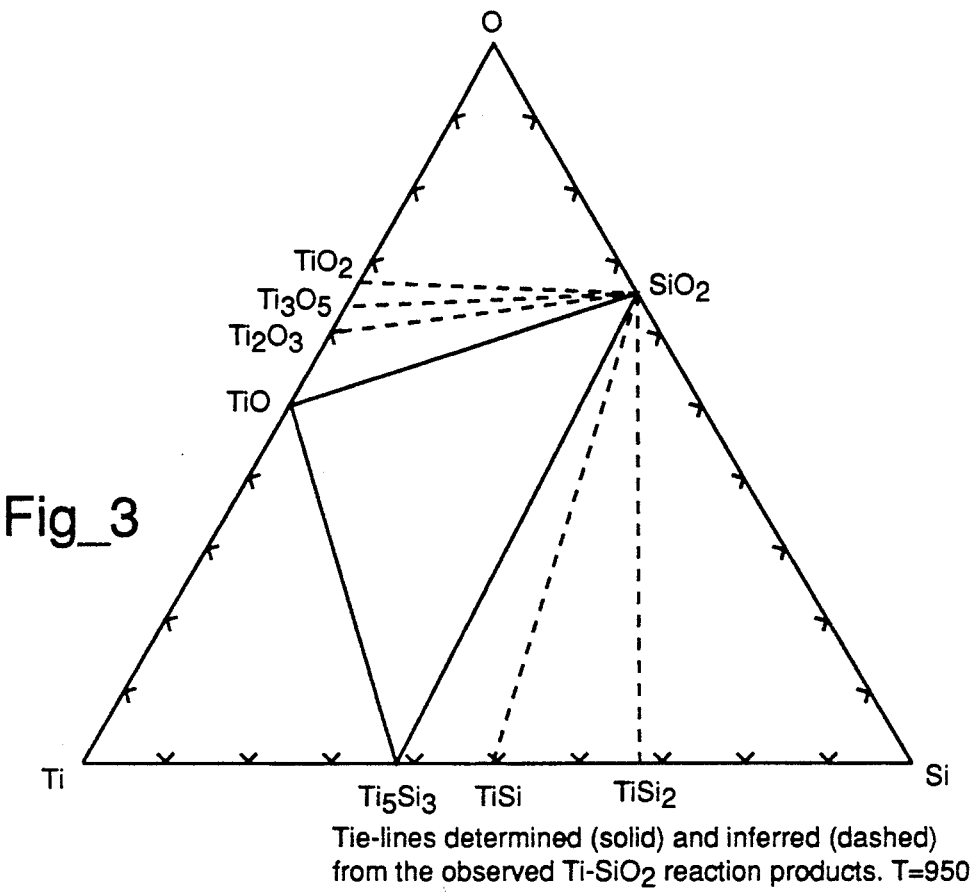
Fig_3
Tie-lines determined (solid) and inferred (dashed) from the observed Ti-SiO₂ reaction products. T=950°C.
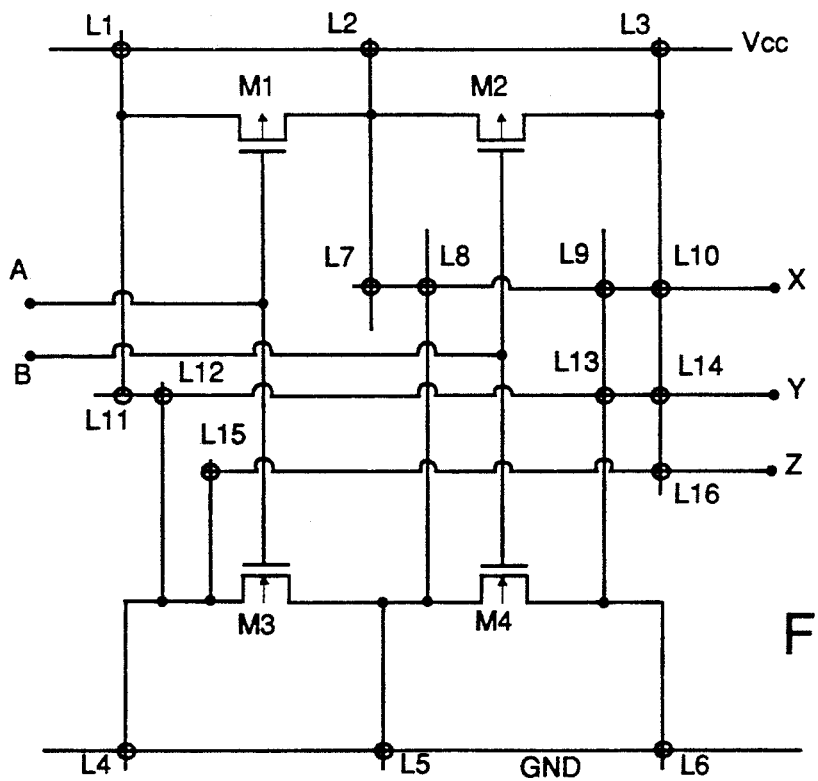
Fig_4

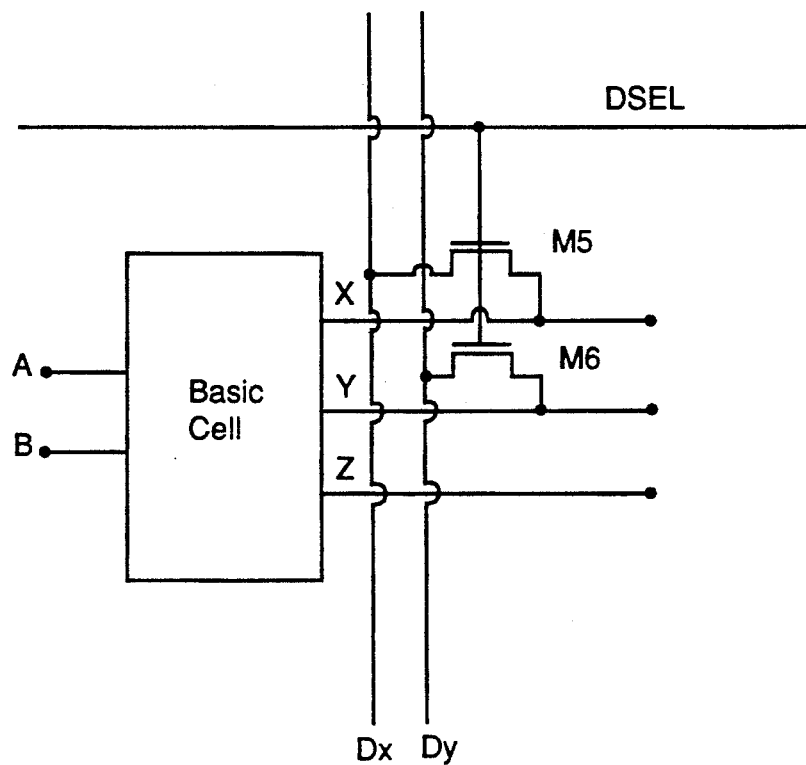
Fig_5
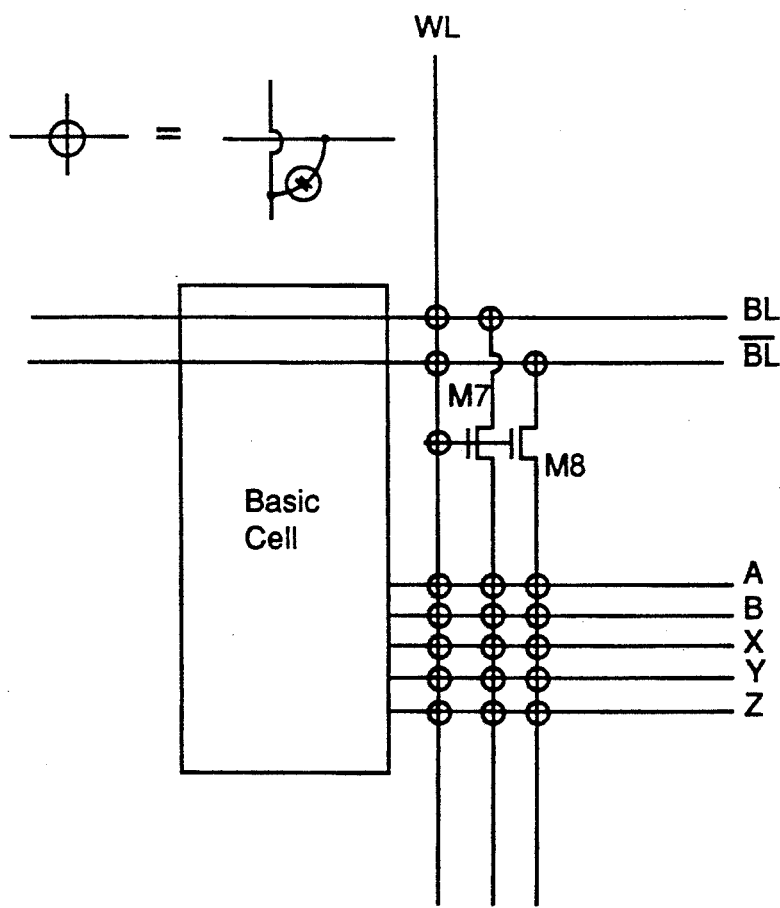
Fig_6

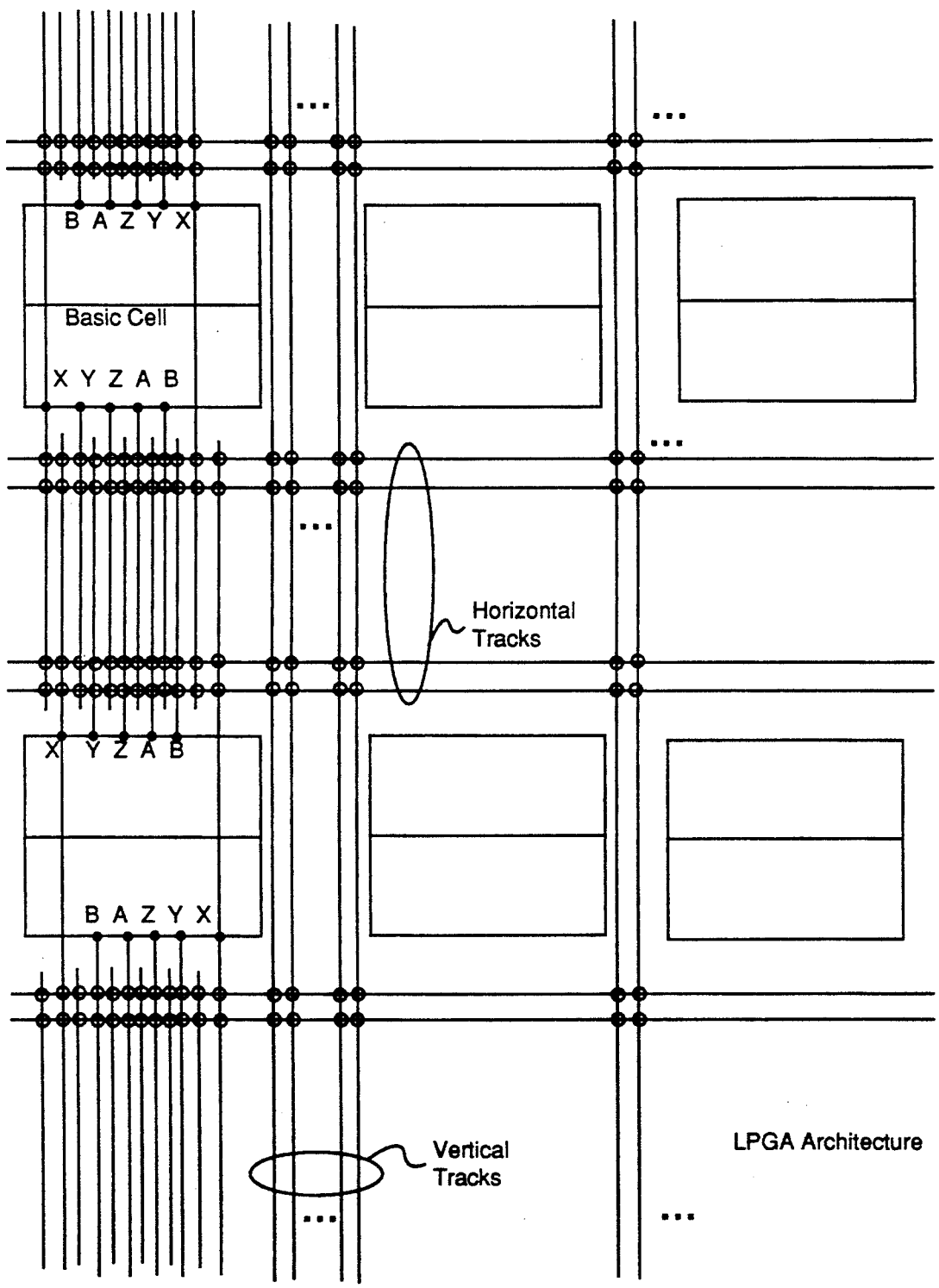
Horizontal Tracks
Vertical Tracks
LPGA Architecture
Extended Primary Output (X)
Fig_7
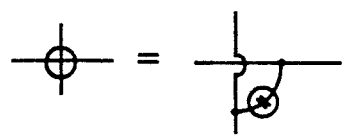

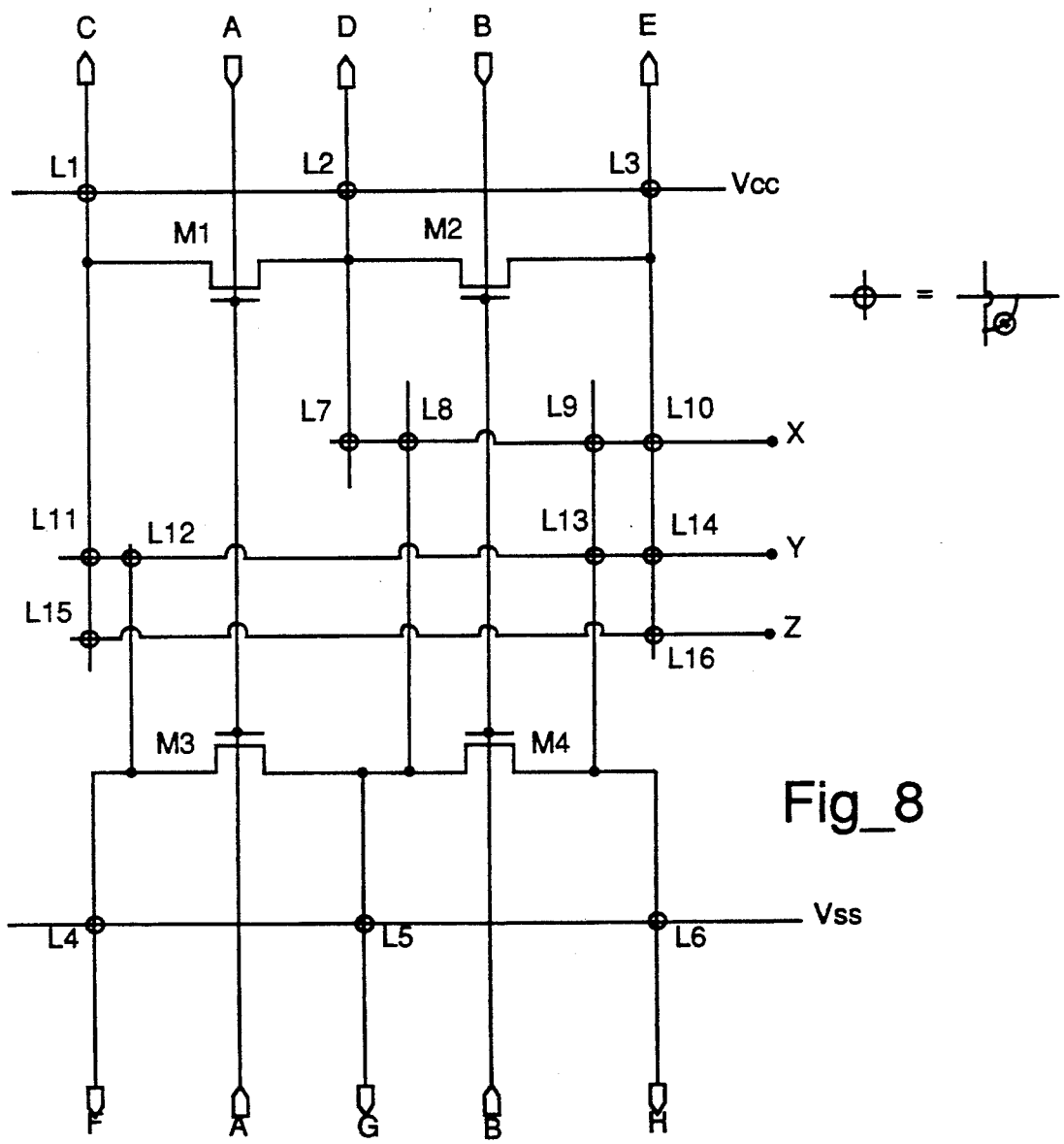
Fig_8

PROGRAMMABLE ANTIFUSE STRUCTURE, PROCESS, LOGIC CELL AND ARCHITECTURE FOR PROGRAMMABLE INTEGRATED CIRCUITS

BACKGROUND OF THE INVENTION

1. Field of the Invention

The invention relates generally to semiconductors and more specifically to the "antifuse" memory cell and interconnect structures used in programmable read only memories (PROMs) and application specific integrated circuits (ASICs).

2. Description of the Prior Art

Many different types of semiconductor devices use memory cells to store programs, data, and other important information. Two basic kinds of memory cells are the random access memory (RAM) and the read only memory (ROM). The memory cells in RAM may be read and written many times, but the storage is not permanent, and data will be erased when power is cut-off. The memory cells in ROM retain their data regardless of whether power is on or off, but once a memory cell is programmed, it generally cannot be reprogrammed. ROMs and ASICs can have data impressed into them by mask processing, laser, electron beam, focused ion beam (FIB), and/or electrical programming. (For laser and FIB programming, see, R. Iscoff, "Characterizing Quickturn ASICs: It's Done with Mirrors," *Semiconductor International,* August 1990, pp.68-73.) ROMs that can be electrically programmed, albeit only once, are called programmable read only memories (PROMs). Memory cells within some PROMs use fuse links that are literally blown open during programming. An opposite type of memory cell using "antifuse" technology, establishes a connection from an open state during programming. In large programmable or configurable systems and circuits, antifuse is much more efficient than fuse because typically only a fraction of antifuses need to be programmed for similar functions implemented with fuses. The prior art method of programming antifuses is almost always electrical programming. Raffel, et al. U.S. Pat. No. 4,585,490, issued Apr. 29, 1986, discloses using thin oxides as a metal diffusion barrier and silicon as a programming layer in a laser programmed device. However, the chemical reaction is simple aluminum alloying which does not have good reliability nor resistance to electromigration.

Polysilicon structures are conventional, and are used in fuse type PROM fabrication. One such structure is described in Preedy U.S. Pat. No. 4,420,820 issued Dec. 13, 1983. A polysilicon layer is formed with laterally spaced surface regions which differ in impurity concentration and which form two back-to-back series diodes functioning as a programmable diode and isolating diode. Because of the different impurity concentrations, one of the diodes will breakdown before the other.

Prior art antifuse methods include the use of dielectrics made of oxide, oxide/nitride/oxide sandwiched between silicon or polysilicon. These structures are characterized by high "ON" resistance ($\geq 1000\Omega$) and high electrical programming voltages ($\geq 15V$). These two characteristics, respectively, make for low performance and difficulty in scaling to submicron processes. This structure, however, does not provide very low leakage current in the "off" state, due to its low bulk conductivity. Amorphized doped silicon by ion implantation has been used in the prior art to create PROM memory cells, and, for example, is described in Stacey, et al. U.S. Pat. No. 4,569,120, issued on Feb. 11, 1986. These structures have not exhibited good control of ON resistance and have limited scalability. Deposited amorphous-silicon on silicon has high parasitic (junction) capacitance, high series resistance and is difficult to remove inside normal contacts without damaging the underlying silicon. (Amorphous silicon is silicon without discernable crystalline grains, as opposed to polycrystalline silicon which has pronounced crystalline grain structures.) An amorphous semiconductor layer for use in a PROM is described in Lim, et al. U.S. Pat. No. 4,569,121 issued on Feb. 11, 1986. The present inventors have observed the best prior art antifuse performance comes from a sandwich layer of titanium-tungsten (TiW)/amorphous-silicon/TiW. Gordon, et al. U.S. Pat. No. 4,914,055, issued on Apr. 3, 1990 describes a TiW-Si-TiW structure that is planar and provides more uniform electric fields across an antifuse structure during programming. (The bottom TiW is not etched or damaged prior to Si deposition.) Hollingsworth U.S. Pat. No. 4,748,490, issued May 31, 1988, describes a deep polysilicon emitter antifuse memory cell having a titanium tungsten (TiW) alloy refractory conductive layer. ("Refractory" means very high melting temperature metal, compared to aluminum, gold, and silver.) There, the antifuse layer is alternatively fabricated from undoped polycrystalline silicon or amorphous silicon. A bipolar transistor that remains after programming is used to provide faster switching of the circuit. However, high temperatures must be used to deposit the amorphous layers, described above, and as such, the prior art techniques require very complicated processes to construct an antifuse element. At least four additional masks and nine more processing steps are typically necessary. Furthermore, the above prior art antifuse structures are not always compatible with standard submicron CMOS/BiCMOS metal processes. Another major disadvantage of amorphous-silicon based antifuse is that the leakage current is generally much higher than oxide or nitride based antifuse due to bulk conductivity differences.

Lower programming and operating currents in memory cells translate directly to smaller programming current devices, size and depth of the cell, and ultimately to the size and current capabilities of devices peripheral to the memory cell array. For example, Hollingsworth, supra, states that a bipolar coupling element provided with a 3100Å thick polysilicon antifuse will require only a 3.12 milliamp programming current. But, still lower programming voltages and currents, e.g., under ten volts and one milliamp, are desirable for the above reasons. Prior art programming voltages and currents for fuse, antifuse, and electrically-programmable read only memory (EPROM) memory cells, each exceed ten volts or one milliamp, or both.

A prior art memory cell comprises a bipolar transistor, a read line, a program line, and a fuse link. The fuse link is literally blown open by a mini-explosion that scatters debris all around the immediate vicinity. A buffer area is required to allow for such material loss without losing circuit functionality. This buffer zone tends to require large areas of chip real estate and devices using the memory cell are not as dense as they otherwise might be. Because such a large programming current is required to blow the fuse link, the transistor must be a bipolar type. MOS transistors are not practical. Large programming currents also mean that minimum sized transistors cannot be used. Thereby further reducing functional device density.

Orbach describes a prior art programmable gate array device in U.S. Pat. No. 4,924,287, issued May 8, 1990. The device comprises laser programmable gate array logic cells where the programmable element is conventional fuselink and the resultant logic function is very limited and cannot implement MPGA functions on a direct gate-to-gate basis.

SUMMARY OF THE PRESENT INVENTION

It is therefore an object of the present invention to provide a silicon containing dielectric based antifuse structure for both electrical and laser programming.

It is a further object of the present invention to provide an antifuse that can be inserted between metals, metal to silicon, and metal to polysilicon.

It is a further object of the present invention to provide an antifuse element that uses a low temperature process under 450° C. and is therefore compatible with standard submicron CMOS/BiCMOS metal processes.

It is a further object of the present invention to provide an antifuse element that has a high OFF resistance above 100M ohm and is adjustable.

It is a further object of the present invention to provide an antifuse element that has a low ON resistance under 100 ohms with electrical programming and under ten ohms with laser programming.

It is a further object of the present invention to provide an antifuse element that has a low ON resistance under 100 ohms with electrical programming voltage scalable from 3V to 40V to suit various applications.

It is a further object of the present invention to provide an antifuse logic cell that allows direct gate-to-gate compatibility with standard mask-programmable gate array (MPGA) implementations.

It is a further objective of the present invention to provide an antifuse-based logic cell that allows one mask conversion to a mask-programmable gate array (MPGA).

Briefly, an integrated circuit of the present invention comprises antifuse elements which have been fabricated by depositing at under 450° C. an antifuse layer approximately 30 nanometers to 400 nanometers between layers of titanium (Ti), said antifuse layer comprising a stoichiometric or off-stoichiometric amorphous layer of silicon nitride ($SiN_x$, where $0<X<1.4$), or silicon-oxide ($SiO_x$, where $0<X\leq2$), or silicon oxynitride ($SiO_xN_y$, where $0<X<2$ and $0<y<1.4$), such that a heating of the said antifuse layer in excess of 500° C. by electrical or energy beam means will cause a chemical reduction reaction between the titanium and silicon-dioxide layers that yields more $Ti_5Si_3$, $TiSi$, and/or $TiSi_2$ than is yielded $TiO$, $Ti_2O_3$, $Ti_3O_5$, and/or $TiO_2$, and such that there results a conductive compound between said titanium layers which constitutes a short circuit.

An advantage of the present invention is that it produces a memory cell and a programmable interconnect device that is fast and occupies a very small area of chip real estate.

Another advantage of the present invention is that it is compatible with standard submicron CMOS/BiCMOS metal processes.

Another advantage of the present invention is that it produces read transistors within memory cells that have high current drive that exceeds 300 microamps and has lower parasitics on the product term lines, resulting in higher device speeds.

Another advantage of the present invention is that it uses lower programming voltages and currents, and frees up space for more memory cells and more programmable interconnections on a given size chip.

Another advantage of the present invention is that fully processed wafers may be laser programmed, both before and after passivation.

Another advantage of the present invention is that a fully assembled die in a package with a windowed lid or without lid may be programmed with a laser or ion beam. Quick turnaround inventory is made practical thereby.

Another advantage of the present invention is that it allows very small metal-oxide semiconductor (MOS) programmable logic device (PLD) and PROM cell sizes.

Another advantage of the present invention is that no real estate is wasted in allowing for a buffer zone around the antifuse element for the damage caused by blasting fuses open during programming.

Another advantage of the present invention is that it allows an antifuse element to be inserted directly into a speed critical path.

Another advantage of the present invention is that very dense interconnect grids with high flexibility, high channel utilization and routing efficiency allow high gate count ASICs.

Another advantage of the present invention is that the lower fusing reaction temperatures required allow laser programming of devices without open windows on a device under test and without cracking any passivation layer.

Another advantage of the present invention is that it provides a programmable logic cell that allows direct gate-to-gate compatibility with standard mask-programmable gate array implementations.

These and many other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a basic antifuse cell with select transistor;

FIG. 2 is a cross-sectional view of an antifuse memory cell of the present invention;

FIG. 3 is a phase diagram of reactions between oxygen, silicon, and titanium;

FIG. 4 is a schematic diagram of a laser programmable gate array basic cell;

FIG. 5 is a schematic diagram of the laser programmable gate array basic cell of FIG. 4 with test transistors;

FIG. 6 is a schematic diagram of the laser programmable gate array basic cell of FIG. 4 with memory transistors;

FIG. 7 is a schematic diagram of a laser programmable gate array architecture; and FIG. 8 is a schematic diagram of an alternative laser programmable gate array basic cell.

DETAILED DESCRIPTION OF THE PREFERRED EMBODIMENTS

FIG. 1 is an antifuse memory cell, referred to by the general reference numeral 10, comprising an antifuse element 12, a read transistor 14, a program/read product term signal line 16, and an input term signal line 18. The input term signal line 18 will control the product term signal line 16 through transistor 14 if antifuse 12 has been programmed (to short circuit). In the exemplary embodiment of FIG. 1, memory cell 10 is programmed by placing ten volts on product term line 16 and five to ten volts on input term signal line 18. Transistor 14 turns on, placing a maximum voltage (10V) across antifuse element 12. This voltage will breakdown the dielectric in antifuse element 12 and cause a permanent short to appear. Read transistor 14 can thereafter control the product term signal line 16. The chip real estate needed to fabricate memory cell 10 is typically 30 $\mu m^2$. This compares very favorably to the 130 $\mu m^2$ required for the prior art two-transistor EPROM memory cell.

Memory cell 10 forms the basic memory unit of a memory array built in a matrix format. Matrices, like these, are very commonly used in ROMs and PROMs. Such an arrangement is conventional. See Hamdy, et al. U.S. Pat. No. 4,899,205, issued Feb. 6, 1990, for a general background discussion of antifuse memory cells arranged in matrices (see FIG. 5a). (The antifuse element itself which is disclosed by Hamdy, et al., requires very high programming voltages and currents and is very different than that disclosed here.)

The present invention employs silicon containing dielectric, such as silicon dioxide or silicon nitride, layers deposited or plasma-enhanced chemical vapor deposited (PECVD) at a relatively low temperature (typically under 400° C., and without exception under 500° C.) which are deposited as antifuse material that is sandwiched between two titanium (Ti) or other refractory metal or metal silicide combinations. Conventional wisdom teaches away from depositing at under 500° C., one reason being to get uniform coverage (high step coverage ratios). But many advantages can be realized by keeping a relatively low processing temperature. And there are further significant advantages that result directly from non-uniform antifuse layer coverage (low step coverage ratios). For example, if the antifuse layer is deposited at less than 450° C., aluminum film may be deposited before an antifuse layer is deposited. Refractory metal or silicide serves as a diffusion barrier layer to prevent reaction between the amorphous layer and the metal layers during normal processing temperatures (under 450° C.). The choice of refractory metal is important because it has to be stable through normal processing temperatures (about 450° C.), but promote fusing at elevated temperatures (550°-650° C.). Preferably titanium, tantalum, titanium-tungsten, or other element/alloy is used as the refractory metal. Such materials enhance the fusing reaction during programming. At least one refractory metal layer is in contact with the dielectric layer(s), and can be above or below the antifuse layer.

FIG. 2 show a semiconductor device, referred to by the general reference numeral 20, after fabrication. Device 20, for example, could comprise memory cell 10, or any other similar device. Device 20 comprises a dielectric 22, a first conductor having a first (optional) metal layer 24 and a first refractory metal or metal silicide layer 26, a contact hole (via) opening 28 (alternatively called a "fuse via" by those skilled in the art), an antifuse layer 30, a second conductor having a second refractory metal or metal silicide layer 32 and a second (optional) metal layer 34. Using a preferred method of the present invention, device 20 is fabricated according to the following steps:

(1) using conventional processing up to the point after contact openings are made
(2) depositing a first metal layer 24 (if needed);
(3) depositing a layer 26 of titanium, or other refractory metal or metal silicide, thicker than 50 nanometers;
(4) masking and etching first metal;
(5) depositing dielectric 22 (and any necessary planarization steps);
(6) etching metal via contact openings 28;
(7) depositing 30 nanometers to 400 nanometers of an off-stoichiometric amorphous silicon-based dielectric layer at under 450° C. to form antifuse layer (the range is from approximately 0% excess silicon to 98% excess silicon in the dielectric layer);
(8) masking and etching antifuse layer 30;
(9) depositing a layer 32 of more than 50 nanometers of titanium or other refractory metal or metal silicide;
(10) depositing second metal layer 34 (if needed); and
(11) masking and etching the second metal layer 34 with conventional processing thereafter.

Steps 3, 7, 8, and 9 are improvements to otherwise conventional processing. Steps 8 and 9 may be swapped for one another. Only one masking and four process steps are needed to construct device 20 and its antifuse structure. Because the process is low temperature, under 450° C., the antifuse structure can be inserted between second and third layer metals. It can also be inserted between polysilicon/doped-silicon and first metal, as long as the polysilicon and/or doped-silicon has a silicide or refractory metal top layer formed either before or after contact hole formation. The above process is based on the reduction reaction between the refractory metal and the silicon-containing dielectric layer. At an elevated temperature, e.g., greater than 500° C., the dielectric layer will decompose in the presence of the refractory metal to form conductive silicides and other dielectrics. An example of this reaction is demonstrated in FIG. 3, showing titanium, silicon, and oxygen (Ti, Si, and O) in a ternary phase diagram. Two elements can co-exist in stable conditions along the tie-lines between the two element sides of the triangle. If two elements without a tie-line are brought into contact, there will be a tendency for them to react with one another to form other phases along the tie-line connection. The lack of a tie-line connection is the basic foundation for the antifuse structure of the present invention. There is no tie-line between Ti and SiO2. As a result, a system containing Ti and $SiO_2$ will form $TiSi_x$ and some $TiO_y$. The silicide provides a low-resistance path for electrical conduction. The rate of the reaction is determined by the kinetics. For most reactions, higher temperatures usually means higher reaction rates. Therefore, even thin films, e.g., $SiO_2$ and Ti, deposited at, e.g., 400° C., and later annealed at 425° C. (as in normal integrated circuit processing) will have a minimum reaction between these two elements due to the initial reaction barrier. At an elevated temperature, e.g., 500° C. and higher, the reaction rate can increase several orders of magnitude and will be completed from within a few nanoseconds to under a second. The reaction can be enhanced by adding more silicon into the dielectric film. The silicon rich film can be easily deposited by changing the gas flow ratio in standard plasma-enhanced chemical vapor deposition (CVD) systems. The dielectric based antifuse has a higher breakdown field than silicon based antifuse. The breakdown voltage can also be adjusted by changing the thickness of the dielectric film and/or silicon content. The dielectric-based antifuse has a much lower leakage current than typical silicon-based antifuse due to the much higher resistance of the dielectric layer. The breakdown field versus leakage current versus parasitic can be tailored/optimized by choosing the proper composition of the antifuse layer. This is not possible in many pure silicon-dioxide and pure silicon applications. Alternatives that accomplish the same dielectric characteristics here may include layer combinations to form the antifuse layer such as, oxide/silicon/oxide, silicon/oxide, or oxide/silicon or other multiple layer combinations. Here the oxide may be silicon dioxide (pure or off-stoichiometric) or titanium oxide formed by either CVD deposition, PECVD, sputtering, plasma ashing, wet chemical oxidation, or low temperature plasma oxidation. The oxide can also be replaced by silicon nitride (pure or off-stoichiometrics). Here the silicon nitride (pure or off-stoichiometric) may be deposited by CVD, sputtering, or PECVD. Similar reduction reactions also exist for Tantalum. Low-temperature deposited or sputtered antifuse takes advantage of the lower step coverage of the deposited layer to further reduce parasitic capacitance with a given programming voltage. The programming spot (point of reaction) is constrained to a small area along the bottom corner of the contact via hole and requires less programming current or energy means. This is consistent with faster programming. The programming voltage is related to the thickness of the antifuse layer 30 inside the fuse via opening 28. The thinner the layer 30, the lower the programming voltage. The parasitic capacitance, on the other hand, is reduced when layer 30 is made thicker. By restricting the cross-sectional area of the fuse, much lower programming currents are realized and minimum sized transistors can also be realized. (The transistor has to support enough current during programming to ensure fusing.) In the case of memory cell 10, transistor 14 can be made very small.

Controlling step coverage in the fabrication of memory cells is very important in controlling the magnitude of programming voltages needed to guarantee programming. (Step coverage is defined as the ratio between the thickness of a material deposited on a flat surface as compared to the thickness of that material deposited in vias or other contact openings.) Having a good step coverage (approaching 100%) is conventionally believed to promote consistently lower programming voltages and smaller memory cell geometries. One way used in the prior art to achieve good step coverage is higher deposition temperatures. Actually, as has been discovered by the present inventors, it is important in antifuse fabrication not to have a uniform film. However, the minimum thickness must occur and be tightly controlled in the bottom inside corners of the vias, as is discussed below. A problem posed by good step coverage (resulting in a uniform film), in the prior art, is that the programming current, programming voltage, and parasitic capacitance are all proportional to the thinnest spot on the film, which, in a uniform film, is everywhere. By allowing low step coverage ratios (coverage inside a via being thinner than outside the via), programming current, programming voltage, and parasitic capacitance vary independently. Of course, low programming current, low programming voltage, and low parasitic capacitance are normally conflicting goals balanced in a compromise controlled by how thick an antifuse layer is deposited.

An alternative method comprises adding an anti-reflection material over the top metal surface to allow more efficient absorption of a programming laser light beam. Anti-reflection materials include refractory metals and/or their silicides, amorphous silicon, and any other material less reflective than aluminum.

Another alternative method comprises heating up the substrate during programming from either the front side or backside of the substrate, the required programming energy can be reduced because the device is already near the reaction temperature.

Laser Programming—The prior art generally uses a laser beam to blow open special fuses or simple metal interconnects. Special windows have to be opened up in the dielectrics on the top and surrounding the fuse to allow a "blast area" and debris removal. Clearance between the fuse and active elements is required to avoid damage. For general background, laser programming of a read only memory is described by Redfern, et al., in U.S. Pat. No. 4,238,839, issued Dec. 9, 1980; and see, Boudou, et al. U.S. Pat. No. 4,893,167, issued Jan. 9, 1990; together with, Boudou, et al. U.S. Pat. No. 4,916,809, issued Apr. 17, 1990. Essentially, laser beam is such that antifuse elements are heated to spot temperatures greater than 550° C. More importantly, programming spots must reach a sufficient temperature to cause a fusing reaction between the antifuse layer and one of tungsten, titanium, or titanium-tungsten alloy in the refractory barrier layer. The antifuse element disclosed by Hamdy, et al., (supra) cannot be programmed by a laser because the fusing reaction does not solely rely on heat, the electrical programming current is a critical element. In contrast, memory cell 10 can be programmed both electrically and by a beam, such as a laser. The fusing reaction in the present invention relies principally on heat. Compared to conventional laser programming, which requires local temperatures of 900° C., or higher, the present invention requires spot temperatures of only 500°–800° C. and in all cases no higher than 900° C. This permits passivated devices to be programmed without danger of cracking the passivation due to deep internal thermal stresses. (The total volume change while programming an antifuse of the present invention is less than 100Å in any one direction, and is therefore easily absorbed.) The method described by Boudou, et al., supra, burns a hole through the passivation layer to fuse two conductors comprising TiW alloy film on aluminum.

The present invention presents an antifuse structure that can be programmed through an energy beam by locally heating up the programming elements (such as antifuses described above or other materials that exhibit a chemical reaction when heated above 500° C. to create a fusing connection. In the case of laser programming, the programming can be carried out either before or after topside passivation. No window opening is required. The wavelength, spot size and energy density are chosen such that the antifuse temperature will heat up to higher than 550° C. to trigger the fusing reaction between refractory metal/alloy and amorphous programming layers. Without substantially damaging the surrounding dielectrics. Pre-fabricated antifuse elements can be programmed while the device is in wafer form before or after topside passivation, in die form, in unlidded package form, or in a package with a windowed lid.

FIG. 4 shows a preferred embodiment of a basic cell having direct gate-to-gate functional compatibility with standard masked programmable gate array (MPGA) implantations. The basic cell comprises four MOS transistors M1-M4, two power lines Vcc and GND, two inputs A and B, and up to three outputs X, Y, and Z. (X is the primary output, Y is the secondary output, and Z is the tertiary output). Up to sixteen antifuses L1-L16 allow the basic cell to be programmed in a variety of configurations. Output Z can have several variations that yield equivalent functionalities: either L15 or L16 can be hardwired (direct short), or L15 and L16 can be placed between output Z and the left side drain of transistor M1 and output Z and the right side drain of transistor M4, respectively. Table I lists the connections needed to implement various MPGA basic functions for one basic cell. Table II applies to two basic cells. Direct one-to-one correspondence to MPGA implementations are demonstrated in all these functions. Not shown, but having an identical implementation as an MPGA are EXCLUSIVE-NOR, EXCLUSIVE-OR, PASS-GATE, LATCHES, and FLIP-FLOPS.

TABLE I

| | Output | Shorted Antifuses |
|---|---|---|
| 1 | $X = \overline{A * B}$ | L1,L3,L7,L9,L4 |
| 2 | $X = \overline{A + B}$ | L1,L8,L10,L4,L6 |
| 3 | $X = \overline{(A = B)}$ | L1,L3,L7,L8,L4,L6 |
| 4 | $X = B$ $Y = A$ | L2,L9,L10,L11,L12,L5 |
| 5 | MUX:X = OUT $A = S_1, B = S_2$ $Y = IN1$ $Z = IN2$ | L7,L8,L11,L13,L15,L16 |

TABLE II

| | Output | CELL 1 | CELL 2 |
|---|---|---|---|
| 1 | $X_2 = \overline{(A_1 * B_1 * A_2 * B_2)}$ $X_2 = X_1, Y_2 = Y_1$ | L1,L3,L7,L4, L13 | L1,L3,L7,L9, L12 |
| 2 | $X_2 = \overline{(A_1 + B_1 + A_2 + B_2)}$ $X_2 = X_1, Y_2 = Y_1$ | L1,L8,L4,L6, L14 | L8,L10,L4,L6 L11 |
| 3 | AOI $X_2 = \overline{(A_1 * B_1 + A_2 * B_2)}$ $Y_2 = X_1, X_2 = Y_1$ | L1,L3,L7, L13,L4 | L11,L14,L7, L9,L4 |

FIG. 5 illustrates an enhanced version of the basic cell of FIG. 4. It consists of the basic cell plus two additional transistors M5 and M6. (One and three additional transistors are also other possible alternatives.). The transistors make it possible to observe the outputs (X, Y, or Z) of each basic cell during testing after cell programming. The direction of DSEL and Dx and Dy can be reversed.

FIG. 6 shows an alternative embodiment of the basic cell of FIG. 4 having two additional data transfer transistors M7 and M8. (More or less transistors are also possible.) Transistors M7 and M8 allow memory implementations (single-port RAM, dual-port RAM or ROM). When the basic cell is not configured as a memory element, both word-line (WL) and bit-lines (BL and $\overline{BL}$) are used as normal interconnect tracks. The directions of WL and BL can be reversed. It is also possible to combine both testing and memory transistors with the basic cell to form other useful embodiments.

FIG. 7 diagrams one way the basic cells (e.g., FIG. 4) can be arranged in an array compatible with laser programming. (The directions, horizontal and vertical are arbitrarily assigned.) Face-to-face rows have input/output lines that share the same set of horizontal tracks for improved routing accessibility and efficiency. Primary output lines X extend to neighboring rows (at least accessible by four rows of basic cells), also for improved routing accessibility and efficiency. Segmented and offset tracks (not shown) in both the horizontal and vertical directions improve utilization and routing efficiency. These segments are connected end-to-end through an antifuse at each breakpoint. The breakpoint at parallel tracks are offset by multiples of the basic cell's dimensions. In a typical configurable/programmable IC with pre-fabricated laser-programmable antifuse elements, the wafers are first fully processed. The user specifies the desired function/logic through netlist, schematics, or logic diagram input. The laser programming system then converts the input into a set of appropriate interconnects that implement the desired functions. The interconnect routing is then converted into a set of antifuse locations to be connected, and the laser is driven to the X-Y locations for programming.

FIG. 8 is an alternative embodiment of the basic cell of FIG. 4. Input (A–B) and output (C–H) lines connected at various points to the four MOS transistors M1–M4 are orthogonal (in their physical layout on a programmable gate array implementation) to transfer lines X, Y, and Z. Antifuses L1–L16 can be programmed such that complex logic combinations can be realized, and such that higher complexity logic functions can be had by utilizing the transfer lines and input.

Preferably, the antifuse elements above comprise elements that have been fabricated by depositing, at under 500° C., an antifuse layer that is approximately 30 nanometers to 400 nanometers thick and lies between layers of titanium, said antifuse layer has a stoichiometric or off-stoichiometric amorphous silicon-based dielectric layer, the elements such that a heating of the said antifuse layer in excess of 500° C. by electrical or energy beam means will cause a chemical reduction reaction between the titanium and silicon-dioxide layers that yields more $Ti_5Si_3$, $TiSi$, and/or $TiSi_2$ than is yielded $TiO$, $Ti_2O_3$, $Ti_3O_5$, and/or $TiO_2$, and such that there results a conductive compound between said titanium layers which substantially constitutes a short circuit.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A process for fabricating antifuse-programmable gate array semiconductor devices having transistors and a plurality of antifuses having two terminals, comprising the steps of:

depositing a first layer of titanium, or other refractory metal or metal silicide;

depositing dielectrics;

forming vias by means of etching;

depositing at under 500° C. an antifuse layer approximately 30 nanometers to 400 nanometers said antifuse layer comprising an amorphous silicon-based dielectric layer;
masking and etching said antifuse layer;
depositing a second layer of a refractory metal or metal silicide.

2. The process of claim 1, wherein:
said antifuse layer which is deposited comprises a stoichiometric or off-stoichiometric amorphous layer of silicon nitride ($SiN_x$, where $0 < x < 1.4$), or silicon oxide ($SiO_x$, where $0 < x \leq 2$), or silicon oxynitride ($SiO_xN_y$, where $0 < x < 2$ and $0 < y < 1.4$).

3. The process of claim 2, wherein:
the depositing and composition of said antifuse layer is such that a later heating of said antifuse layer in excess of 500° C. by an electrical current means or an energy beam means will cause a chemical reduction reaction between the refractory metal or metal silicide and silicon-based layers that yields more conductive material than is yielded non-conductive material, and such that there results a conductive compound between said refractory metal or metal silicide layers which constitutes a short circuit.

4. The process of claim 1, wherein:
the step of depositing the first and/or second layers of refractory metal or metal silicide comprises depositing a material selected from the group consisting of titanium, titanium-tungsten, tantalum, or any combination of titanium, titanium-tungsten and tantalum.

5. The process of claim 1, further including:
depositing a first metal layer before depositing said first layer of refractory metal or metal silicide.

6. The process of claim 1, further including:
depositing a first metal layer before depositing said first layer of refractory metal or metal silicide; and
masking and etching said first metal after depositing a first layer of titanium, or other refractory metal or metal silicide.

7. The process of claim 1, wherein:
said first layer of refractory metal or metal silicide is deposited thicker than 50 nanometers.

8. The process of claim 1, further including:
depositing any necessary planarization steps after depositing dielectrics.

9. The process of claim 1, wherein:
the depositing of a silicon-based dielectric layer is such that it is in the range of approximately zero excess silicon to ninety-eight percent silicon in said dielectric layer.

10. The process of claim 1, wherein:
said second layer of titanium, or other refractory metal or metal silicide is deposited thicker than 50 nanometers.

11. The process of claim 1, further including after depositing said second layer of refractory metal or metal silicide;
depositing a first metal layer; and
masking and etching said second metal layer with conventional processing thereafter.

12. The process of claim 11, further including:
depositing an antifuse layer between said second metal layer and a third metal layer.

13. A process for fabricating antifuse-programmable gate array semiconductor devices having transistors and antifuses having two terminals, comprising the steps of:
depositing a first layer of titanium more than 50 nanometers thick;
depositing dielectrics;
forming vias by means of etching;
depositing at under 500° C. an antifuse layer approximately 30 nanometers to 400 nanometers comprising an amorphous silicon-based dielectric layer;
masking and etching said antifuse layer; and
depositing a second layer of titanium more than 50 nanometers thick.

14. A gate array cell, comprising:
two n-channel MOS transistors and two p-channel MOS transistors;
a plurality of power supply lines;
a plurality of input and output lines; and
a plurality of antifuse elements, positioned and connected with said MOS transistors, said input, said output, and said power supply lines such that by programming selected antifuse elements the MOS transistors may be configured to produce logic functions between the input lines and output lines, said logic functions comprising NOR, NAND, NOT, and pass-gate, and combinations of NOR, NAND, NOT, and pass-gate.

15. The gate array cell of claim 14, wherein:
said antifuse elements comprise elements which have been fabricated by depositing, at under 500° C., an antifuse layer that is approximately 30 nanometers to 400 nanometers thick and lies between layers of refractory metal, said antifuse layer having a stoichiometric or off-stoichiometric amorphous silicon-based dielectric layer, such that a heating of said antifuse layer in excess of 500° C. by an electrical current means or an energy beam means will cause a chemical reduction reaction between the refractory metal and silicon-based dielectric layers such that there results a conductive compound between said refractory metal layers which substantially constitutes a short circuit.

16. The gate array cell of claim 14, further comprising:
at least one transistor that enables the observation of at least one of the output lines such that testing of the gate array cell is enhanced.

17. The gate array cell of claim 14, further comprising:
at least one data transfer transistor that enables implementation of memory cells by said MOS transistors when cross-coupled as a bistable latch, the data transfer transistors having a common gate controlled by a word line and antifuse elements able to connect the drains and sources of the data transfer transistors in a variety of ways to the input and output lines, bit lines, and word line.

18. A gate array cell, comprising:
a first set of at least two n-channel MOS transistors and at least two p-channel MOS transistors;
a plurality of power supply lines;
a first plurality of input and output lines;
a first plurality of antifuse elements, positioned and connected with the first MOS transistors and first input and output lines and power supply lines such that by programming selected first antifuse elements the first MOS transistors may be configured to produce logic functions between the input lines and output lines, said logic functions comprising NOR, NAND, NOT, and pass-gate, and combinations of NOR, NAND, NOT, and pass-gate;

a second set of at least two n-channel MOS transistors and at least two p-channel MOS transistors;

a second plurality of input and output lines; and a second plurality of antifuse elements, positioned and connected with the second MOS transistors and second input and output lines and power supply lines such that by programming selected second antifuse elements the second MOS transistors may be configured to produce logic functions between the input lines and output lines, said logic functions comprising NOR, NAND, NOT, and pass-gate, and combinations of NOR, NAND, NOT, and pass gate.

19. A gate array cell, comprising:

a first through fourth MOS transistor, the first and second MOS transistors being p-channel, the third and fourth MOS transistors being n-channel, the first and third MOS transistors having their gate electrodes in common with a first input line, the second and fourth MOS transistors having their gate electrodes in common with second input line, the first and second MOS transistors having the drain of the first MOS transistor connected to the source of the second MOS transistor and a first output line, the third and fourth MOS transistors having the drain of the third MOS transistor connected to the source of the fourth MOS transistor and a second output line, a third output line connected to the source of the first MOS transistor, a fourth output line connected to the drain of the second MOS transistor, a fifth output line connected to the source of the third MOS transistor, and a sixth output line connected to the drain of the fourth MOS transistor;

a plurality of transfer and power lines; and a plurality of antifuse elements, positioned and connected such that by programming selected antifuse elements a variety of connection combinations can be independently established between the transfer lines, power lines, first and second input lines, and first through sixth output lines.

20. The gate array cell of claim 19, wherein:

the programming of selected antifuse elements is such that the MOS transistors can be configured to produce logic functions between the input lines and output lines, said logic functions comprising NOR, NAND, NOT, and pass-gate, and combinations of NOR, NAND, NOT, and pass-gate.

21. The gate array cell of claim 19, wherein:

the antifuse elements have been fabricated by depositing, at under 500° C., an antifuse layer that is approximately 30 nanometers to 400 nanometers thick and lies between layers of refractory metal, said antifuse layer having a stoichiometric or off-stoichiometric amorphous silicon-oxide layer, such that a heating of said antifuse layer in excess of 500° C. by an electrical current means or an energy beam means will cause a chemical reduction reaction between the refractory metal and silicon-dioxide layers such that there results a conductive compound between said refractory metal layers which substantially constitutes a short circuit.

22. An improved programmable integrated circuit having an antifuse structure, the improvement comprising:

a plurality of antifuse elements that have been fabricated by depositing, at under 500° C., an antifuse layer that is approximately 30 nanometers to 400 nanometers thick and lies between layers of titanium, said antifuse layer having an amorphous silicon-based dielectric layer, such that a heating of said antifuse layer in excess of 500° C. by an electrical current means or an energy beam means will cause a chemical reduction reaction between the titanium and silicon-based layers that yields more $Ti_5Si_3$, $TiSi$, and/or $TiSi_2$ than is yielded $TiO$, $Ti_2O_3$, $Ti_3O_5$, and/or $TiO_2$, and such that there results a conductive compound between said titanium layers which substantially constitutes a short circuit.

* * * * *